(12) United States Patent
Zhu et al.

(10) Patent No.: US 11,825,646 B2
(45) Date of Patent: Nov. 21, 2023

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Bingyu Zhu, Hefei (CN); Jingwen Lu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 217 days.

(21) Appl. No.: 17/498,806

(22) Filed: Oct. 12, 2021

(65) Prior Publication Data
US 2022/0302126 A1 Sep. 22, 2022

Related U.S. Application Data

(63) Continuation of application No. PCT/CN2021/104830, filed on Jul. 6, 2021.

(30) Foreign Application Priority Data
Mar. 18, 2021 (CN) .......................... 202110290442.4

(51) Int. Cl.
*H01L 21/3213* (2006.01)
*H01L 21/311* (2006.01)
*H10B 12/00* (2023.01)

(52) U.S. Cl.
CPC ...... *H10B 12/482* (2023.02); *H01L 21/31144* (2013.01); *H01L 21/32139* (2013.01)

(58) Field of Classification Search
CPC ......... H01L 21/31144; H01L 21/32139; H10B 12/482

USPC .......................................................... 438/653
See application file for complete search history.

(56) References Cited

U.S. PATENT DOCUMENTS

| 9,190,486 B2 | 11/2015 | Xie et al. |
| 10,818,671 B2 | 10/2020 | Lee et al. |
| 10,825,722 B1 | 11/2020 | Kuan |
| 11,239,111 B1* | 2/2022 | Huang ............... H01L 21/76831 |
| 2011/0303974 A1* | 12/2011 | Kim .................... H10B 12/482 |
| | | 257/329 |
| 2014/0138779 A1 | 5/2014 | Xie et al. |

(Continued)

FOREIGN PATENT DOCUMENTS

| CN | 104617093 A | 5/2015 |
| CN | 108777253 A | 11/2018 |

(Continued)

*Primary Examiner* — Igwe U Anya
(74) *Attorney, Agent, or Firm* — Cooper Legal Group, LLC

(57) ABSTRACT

A method for manufacturing a semiconductor structure and a semiconductor structure are provided. The method includes the following steps. A bit line structure is formed on a substrate. Each of the bit lines is provided with an insulation block on a side facing away from the substrate. A shielding portion is formed on a top of the insulation block that faces away from the substrate. A projection area of the shielding portion on the substrate is larger than a projection area of the insulation block on the substrate. An insulation sidewall is formed on a sidewall of the bit line and a sidewall of the insulation block, and a gap extending to the substrate is formed within the insulation sidewall corresponding to the shielding portion.

15 Claims, 15 Drawing Sheets

(56) References Cited

U.S. PATENT DOCUMENTS

| | | | |
|---|---|---|---|
| 2014/0306351 A1* | 10/2014 | Kim | H01L 21/76831 438/653 |
| 2017/0005097 A1* | 1/2017 | Kim | H01L 21/7682 |
| 2018/0226410 A1* | 8/2018 | Chang | H10B 12/485 |
| 2019/0067080 A1 | 2/2019 | Chiu et al. | |
| 2019/0157275 A1 | 5/2019 | Lee et al. | |
| 2020/0020697 A1* | 1/2020 | Kim | H10B 12/482 |

FOREIGN PATENT DOCUMENTS

| | | |
|---|---|---|
| CN | 110034094 A | 7/2019 |
| CN | 112447583 A | 3/2021 |
| CN | 113053808 A | 6/2021 |

\* cited by examiner

METHOD FOR MANUFACTURING SEMICONDUCTOR STRUCTURE AND SEMICONDUCTOR STRUCTURE

CROSS-REFERENCE TO RELATED APPLICATIONS

The present application is a U.S. continuation application of International Application No. PCT/CN2021/104830, filed on Jul. 6, 2021, which claims priority to Chinese Patent Application No. 202110290442.4, filed on Mar. 18, 2021. International Application No. PCT/CN2021/104830 and Chinese Patent Application No. 202110290442.4 are incorporated herein by reference in their entireties.

TECHNICAL FIELD

Embodiments of the disclosure relate to the field of semiconductor manufacturing technology, and particularly to a method for manufacturing a semiconductor structure and a semiconductor structure.

BACKGROUND

A Dynamic Random Access Memory (DRAM) is a relatively common storage device. The DRAM includes a transistor structure and a capacitor structure, a transistor in the transistor structure is electrically connected to a capacitor in the capacitor structure so as to read data from the capacitor or write data into the capacitor through the transistor.

In a related art, the transistor structure includes a substrate, a bit line structure provided on the substrate, the bit line structure including a plurality of bit lines parallel to and spaced apart from each other, and a metal plug being formed between the bit lines which is configured to connect the capacitor structure. In order to prevent a capacitance from being formed between the metal plug and the bit line, an insulation sidewall is often formed on a side wall of each bit line that is perpendicular to the substrate, and a gap is formed within the insulation sidewall. During manufacturing, a first insulation sidewall, a sacrificial layer, and a second insulation sidewall are sequentially formed on the sidewall of the bit line, and then the sacrificial layer is removed so that a gap is formed within the insulation sidewall composed of the first insulation sidewall and the second insulation sidewall.

However, the method for forming the gap in the related art is complex and difficult in the manufacturing process.

SUMMARY

An embodiment of the disclosure provides a method for manufacturing a semiconductor structure, which includes the following steps.

A substrate is provided.

A bit line structure is formed on the substrate. The bit line structure includes a plurality of bit lines parallel to and spaced apart from each other, and each of the bit lines is provided with an insulation block on a side facing away from the substrate.

A shielding portion is formed on a top of the insulation block that faces away from the substrate, and a projection area of the shielding portion on the substrate is larger than a projection area of the insulation block on the substrate.

An insulation sidewall is formed on a sidewall of the bit line and a sidewall of the insulation block, and a gap extending to the substrate is formed within the insulation sidewall corresponding to the shielding portion.

An embodiment of the disclosure provides a semiconductor structure, which is obtained by the above-mentioned method for manufacturing a semiconductor structure.

The embodiments of the disclosure provide a method for manufacturing a semiconductor structure and a semiconductor structure. The manufacturing method specifically includes the following steps. A substrate is provided. A bit line structure is formed on the substrate. The bit line structure includes a plurality of bit lines parallel to and spaced apart from each other. Each of the bit lines is provided with an insulation block on a side facing away from the substrate. A shielding portion is formed on a top of the insulation block that faces away from the substrate. A projection area of the shielding portion on the substrate is larger than a projection area of the insulation block on the substrate. An insulation sidewall is formed on a sidewall of the bit line and a sidewall of the insulation block, and a gap extending to the substrate is formed within the insulation sidewall corresponding to the shielding portion. Since the projection area of the shielding portion on the substrate is larger than the projection area of the bit line structure on the substrate, during the process of forming the insulation sidewall, a region between the shielding portion and the substrate will be sealed in advance, and thus the gap extending to the substrate is formed within the insulation sidewall corresponding to the shielding portion. The step of forming the gap within the insulation sidewall at the same time when the insulation sidewall is formed simplifies the manufacturing process and reduces manufacturing difficulty.

BRIEF DESCRIPTION OF THE DRAWINGS

In order to describe the technical solutions in the embodiments of the disclosure or the related art more clearly, the drawings required to be used in descriptions about the embodiments or the related art will be simply introduced below. It is apparent that the drawings in the following descriptions are some embodiments of the disclosure. Those of ordinary skill in the art may further obtain other drawings according to these drawings without creative work.

DESCRIPTION OF REFERENCE NUMERALS

Figure 1:
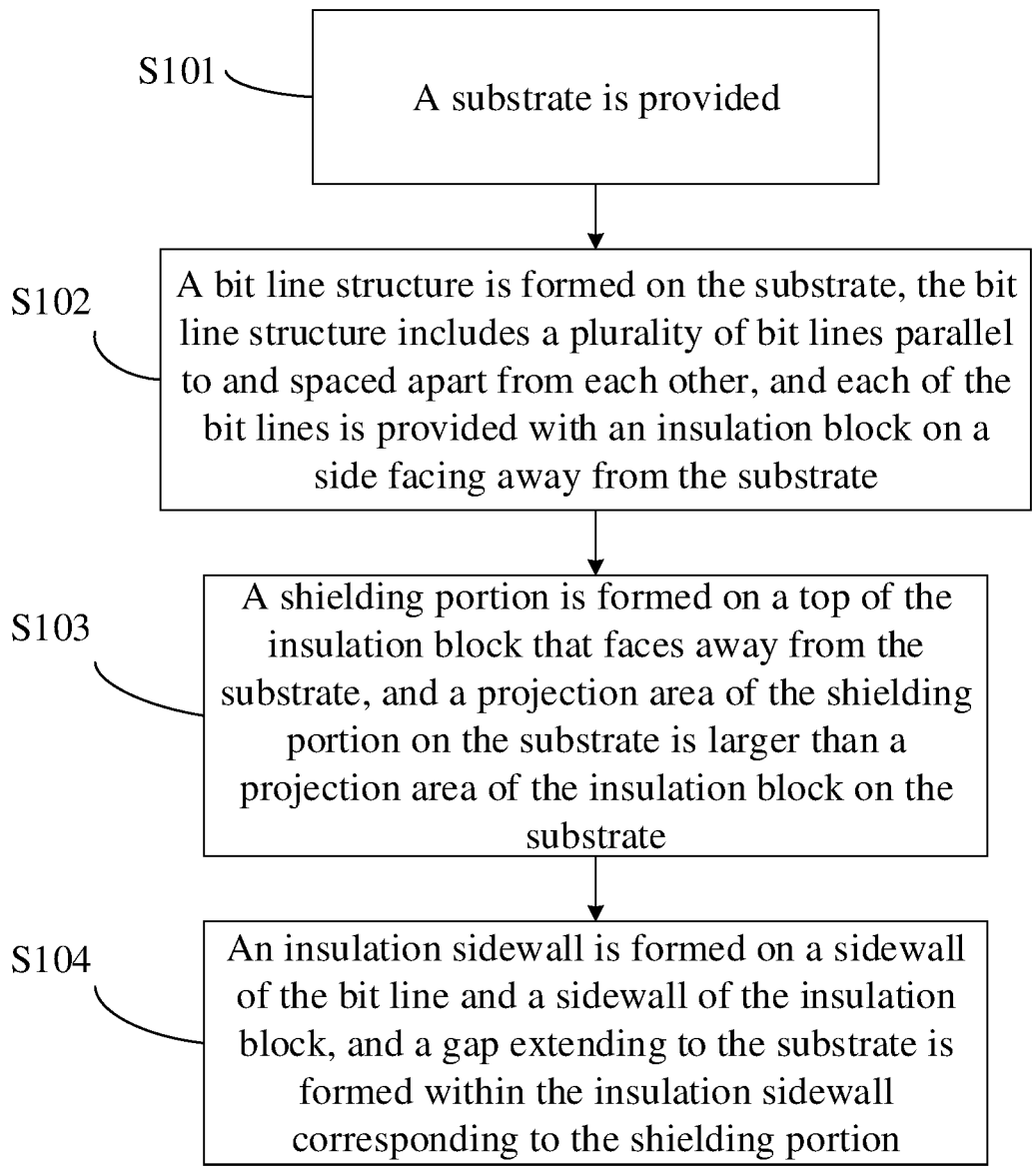
FIG. 1 is a flowchart of a method for manufacturing a semiconductor structure provided in an embodiment of the disclosure.

100: Substrate; 101: active region;
102: isolation structure; 200: bit line;
210: second conductive layer; 220: conductive barrier layer;
230: first conductive layer; 240: conductive layer;
201: second conductive block; 202: conductive barrier block;
203: first conductive block; 300: insulation block;
310: second insulation layer; 320: first insulation layer;
330: insulation layer; 301: second insulation block;
302: first insulation block; 400: lithography layer;
500: first sacrificial layer; 510: sacrificial sidewall;
520: sacrificial block; 600: second sacrificial layer;
700: covering layer; 710: shielding portion;
800: insulation material layer; 900: Gap.

DETAILED DESCRIPTION

In order to understand the technical solutions of the disclosure clearly, the solution of the conventional art is first introduced in detail.

In a related art, a transistor structure includes a substrate, a bit line structure provided on the substrate, the bit line structure including a plurality of bit lines parallel to and spaced apart from each other, and a metal plug being formed between the bit lines which is configured to connect a capacitor structure. In order to prevent a capacitance from being formed between the metal plug and the bit line, an insulation sidewall is often formed on a side wall of each bit line that is perpendicular to the substrate, and a gap is formed within the insulation sidewall. During manufacturing the gap with the related art, a first insulation sidewall, a sacrificial layer, and a second insulation sidewall are sequentially formed on the sidewall of the bit line, and then the sacrificial layer is removed by etching so that the gap is formed within insulation sidewalls composed of the first insulation sidewall and the second insulation sidewall. In the related art, the sacrificial layer between the first insulation sidewall and the second insulation sidewall needs to be manufactured first, and then the sacrificial layer is removed by etching so that the gap between the first insulation sidewall and the second insulation sidewall is formed. The manufacturing process is complex and very difficult.

In view of this, the embodiments of the disclosure provide a method for manufacturing a semiconductor structure and a semiconductor structure. The method for manufacturing a semiconductor structure includes the following steps. A bit line structure is formed. A shielding portion is formed on a top of the bit line that faces away from a substrate, a projection area of the shielding portion at the substrate being larger than a projection area of the bit line structure on the substrate. Then, an insulation sidewall having a gap is formed on a sidewall of the bit line structure. Since the projection area of the shielding portion on the substrate is larger than the projection area of the bit line structure on the substrate, during the process of forming the insulation sidewall, a region between the shielding portion and the substrate will be sealed in advance, and thus the gap extending to the substrate is formed within the insulation sidewall corresponding to the shielding portion, which simplifies the manufacturing process and reduces manufacturing difficulty.

Several alternate implementation modes of the disclosure will be described below with reference to the accompanying drawings, and those skilled in the art will appreciate that the following implementation modes are merely schematic, rather than an exhaustive list. Based on the implementation modes, those skilled in the art may replace, splice or combine certain features or examples, which still be considered as disclosed herein.

The semiconductor structure in the embodiment may be a Dynamic Random Access Memory (DRAM). Of course, the semiconductor may also be another structure. The embodiment does not limit this.

FIG. 1 illustrates a flowchart of a method for manufacturing a semiconductor structure. As shown in FIG. 1, the manufacturing method provided in the embodiments of the disclosure includes the following steps.

At S101, a substrate is provided.

Figure 2:
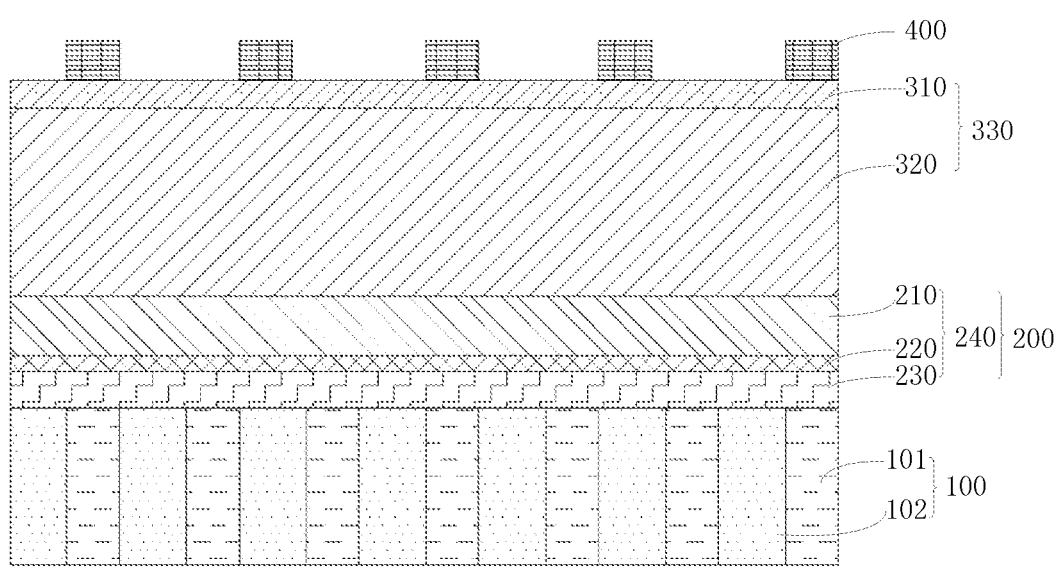
FIG. 2 is a sectional view of formation of a lithography layer provided in an embodiment of the disclosure.

It is to be noted that, as shown in FIG. 2, a material of the substrate 100 may include single crystal silicon, polycrystalline silicon, amorphous silicon, silicon germanium compound, or silicon on insulator, or the like, or other materials known to those skilled in the art. An active region 101, an isolation structure 102, and a bit line contact, or the like may be formed within the substrate 100, in which the active regions 101 are arranged in an array, and the isolation structures 102 are located on the periphery of the active regions 101 for isolating the adjacent active regions 101.

Referring to FIG. 2 again, the substrate 100 provided in the embodiment includes the active region 101 and the isolation structure 102. A material of the active region 101 may include silicon, and a material of the isolation structure 102 may include silicon oxide.

The method for manufacturing a semiconductor structure provided in the embodiment also includes, after providing the substrate 100, the following steps.

At S102, a bit line structure is formed on the substrate. The bit line structure includes a plurality of bit lines parallel to and spaced apart from each other, and each of the bit lines is provided with an insulation block on a side facing away from the substrate.

Figure 3:
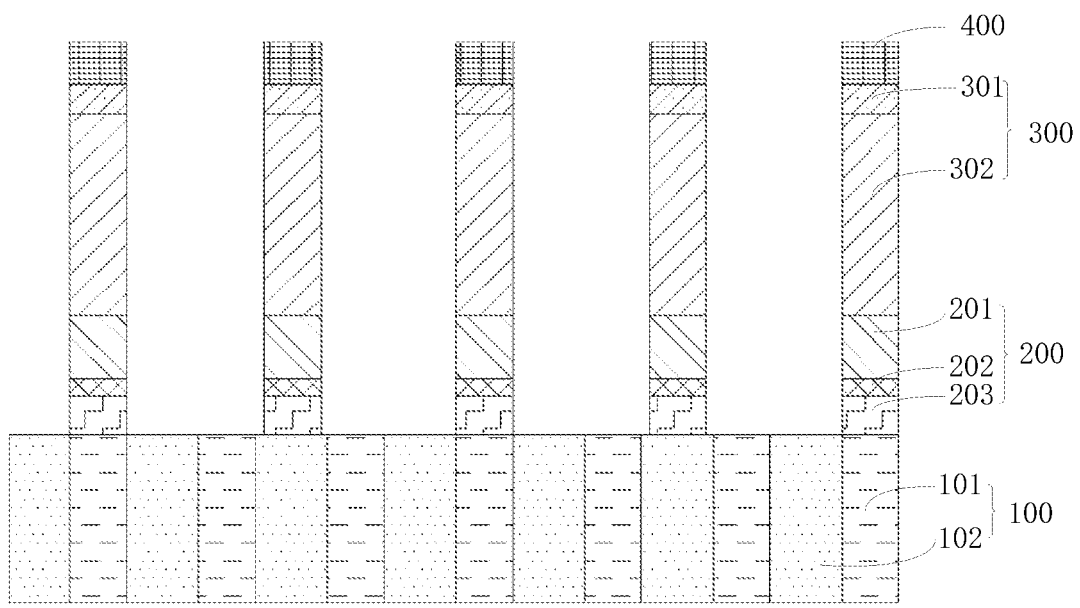
FIG. 3 is a sectional view of formation of a bit line structure provided in an embodiment of the disclosure.

Referring to FIG. 2 again and FIG. 3, a bit line 200 is a conductive structure, and the bit line 200 may be connected with a source in a transistor.

In the above-mentioned implementation mode, the step of manufacturing the bit line 200 may include the following steps. A conductive layer 240 and an insulation layer 330 which are stacked in sequence are formed on the substrate 100. Then a lithography layer 400 is formed on the insulation layer 330, in which the lithography layer 400 has an etching pattern thereon. The insulation layer 330 and the conductive layer 240 are etched with the lithography layer 400 as a mask to form the bit line 200, and an insulation block 300 at a side of the bit line 200 facing away from the substrate 100. The bit line 200 is formed by etching, which improves dimensional accuracy of the bit line 200.

Further, the step of forming the conductive layer 240 may include the following steps. A first conductive layer 230, a conductive barrier layer 220, and a second conductive layer 210 which are stacked in sequence are formed on the substrate 100. A material of the first conductive layer 230 may include polycrystalline silicon, a material of the conductive barrier layer 220 may include titanium and titanium nitride, and a material of the second conductive layer 210 may include tungsten, copper, or silver. The conductive barrier layer 220 may prevent the materials of the first conductive layer 230 and the second conductive layer 210 from penetrating each other, thereby improving the performance of the semiconductor structure.

In an implementation mode that the material of the first conductive layer 230 is polycrystalline silicon, the polycrystalline silicon may be formed at a temperature of 480 degrees Celsius to 520 degrees Celsius.

In some embodiments, the step of forming the insulation layer 330 may include the following steps. A first insulation layer 320 and a second insulation layer 310 which are stacked in sequence are formed on the conductive layer 240. A material of the first insulation layer 320 may include silicon nitride, and a material of the second insulation layer 310 may include silicon oxynitride.

Referring to FIG. 2 and FIG. 3 again, after forming the insulation layer 330, the insulation layer 330 and the conductive layer 240 are etched with the photoresist as a mask to remove part of conductive layer 240 so as to form a plurality of bit lines 200 extending on the substrate 100, in which the plurality of bit lines 200 are parallel to and spaced apart from each other. A first conductive block 203 is formed after part of the first conductive layer 230 is removed, a conductive barrier block 202 is formed after part of the conductive barrier layer 220 is removed, and a second conductive block 201 is formed after part of the second conductive layer 210 is removed. At the same time, part of the insulation layer 330 is removed to retain part of the insulation layer 330 on the side of the bit line 200 that faces away from the substrate 100, and thus an insulation block 300 on a side of the bit line 200 that faces away from the substrate 100 is formed. A first insulation block 302 is formed after part of the first insulation layer 320 is removed, and a second insulation block 301 is formed after part of the second insulation layer 310 is removed. Through the above settings, the insulation block 300 may protect the bit line 200.

It is to be noted that the lithography layer 400 needs to be removed after the bit line 200 structure is formed to avoid affecting subsequent processes.

The method for manufacturing a semiconductor structure provided in the embodiment also includes, after forming the bit line 200 structure, the following steps.

At S103, a shielding portion is formed on a top of the insulation block that faces away from the substrate, in which a projection area of the shielding portion on the substrate is larger than a projection area of the insulation block on the substrate.

Figure 12:
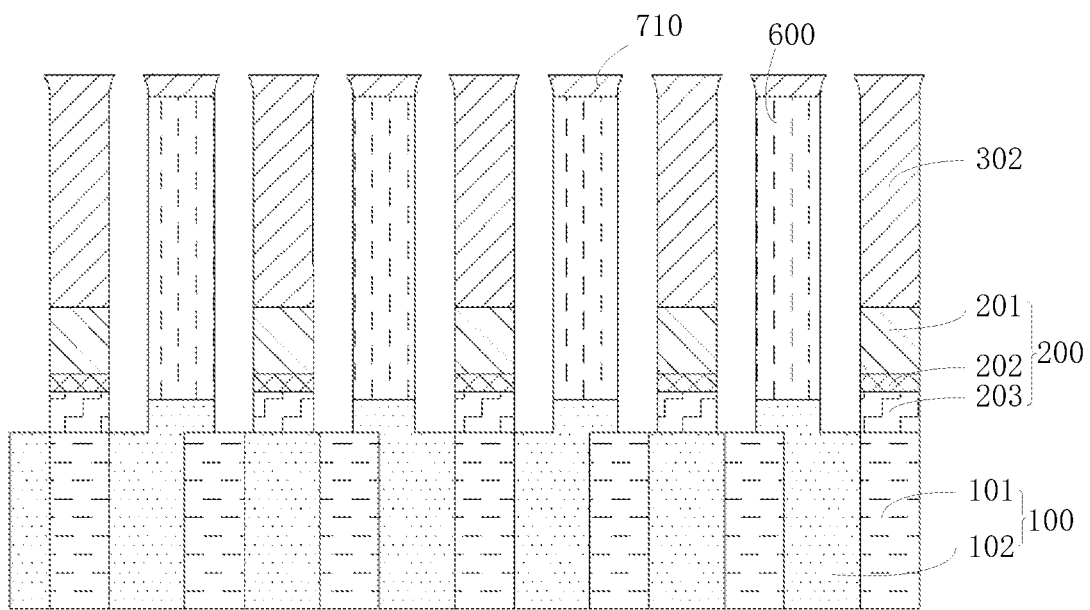
FIG. 12 is a sectional view of removal of a sacrificial sidewall provided in an embodiment of the disclosure.

As shown in FIG. 12, the method of forming a shielding layer on the top of the insulation block 300 that faces away from the substrate 100 first, and then etching the shielding layer into a desired shape may be adopted to form a shielding portion 710. Of course, a chemical vapor deposition or a physical vapor deposition may also be adopted to directly form the shielding portion 710 that has a desired shape on the top of the insulation block 300 that faces away from the substrate 100.

Figure 10:
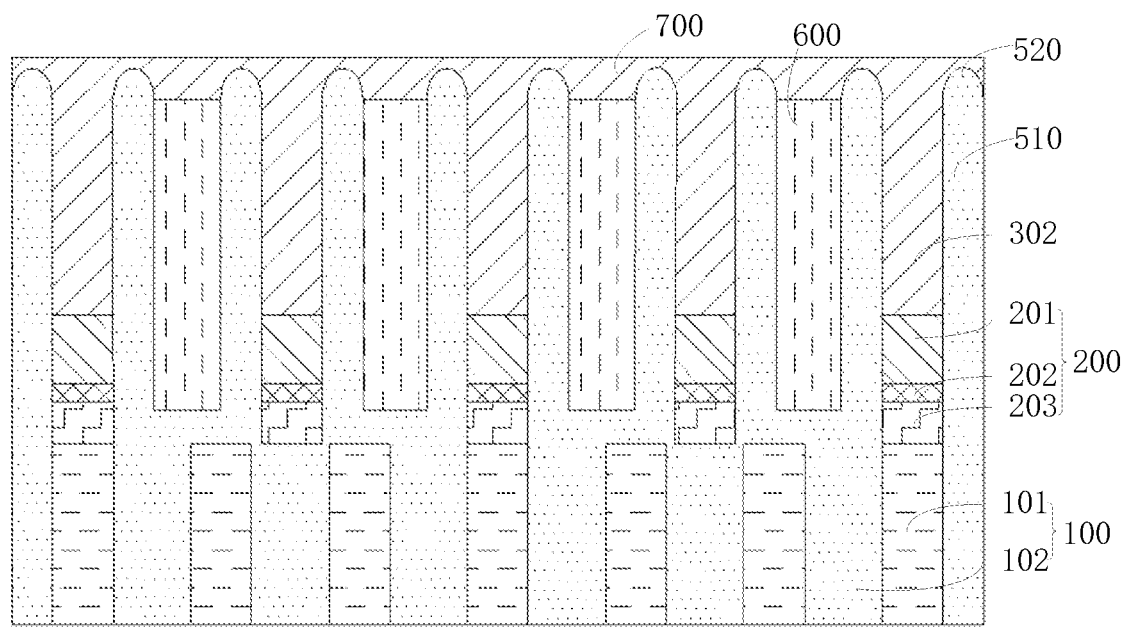
FIG. 10 is a sectional view of formation of a covering layer provided in an embodiment of the disclosure.
Figure 11:
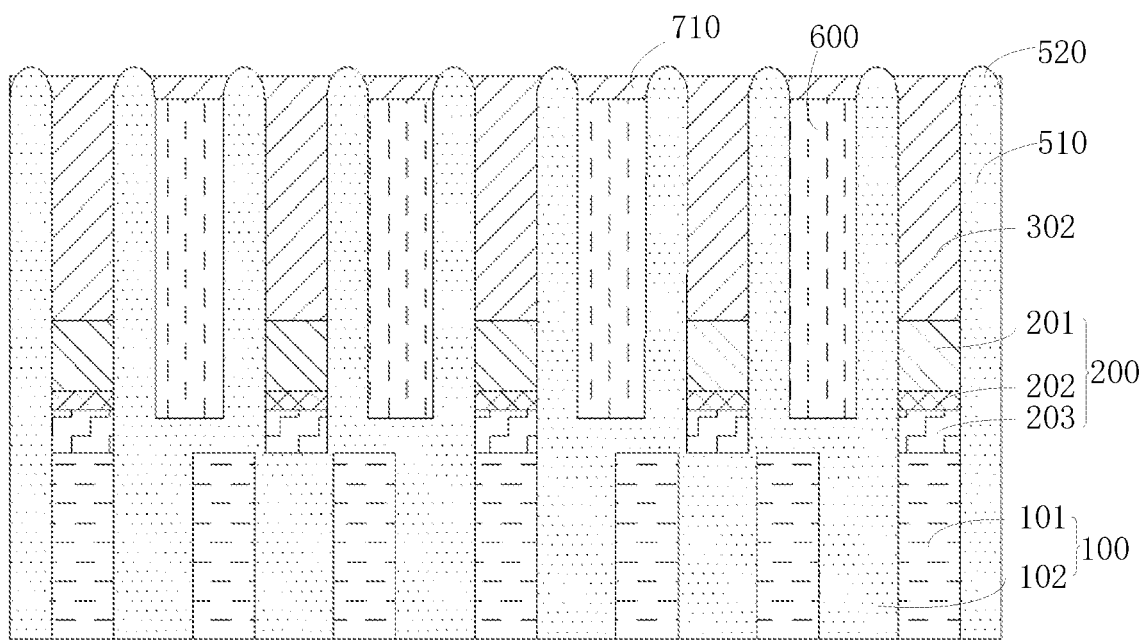
FIG. 11 is a sectional view of formation of a shielding portion provided in an embodiment of the disclosure.

As shown in FIG. 10 and FIG. 11, in the embodiment, the step of forming the shielding portion 710 on the top of the insulation block 300 that faces away from the substrate 100 includes the following steps. A sacrificial sidewall 510 is formed on a sidewall of the insulation block 300 and a sidewall of the bit line 200, in which the height of the sacrificial sidewall 510 is greater than the sum of the height of insulation block 300 and the height of the bit line 200. The sacrificial sidewall has a sacrificial block 520 at its top end that faces away from the substrate 100, a cross-sectional area of which decreases gradually in a direction away from the substrate 100.

Then, a covering layer 700 is formed, in which part of the covering layer 700 is filled between sacrificial blocks 520 at both sides of the bit line 200 to form a shielding portion 710.

The method for manufacturing a semiconductor structure provided in the embodiment also includes, after forming the shielding portion 710, the following steps.

At S104, an insulation sidewall is formed on the sidewall of the bit line and the sidewall of the insulation block, and a gap 900 extending to the substrate is formed within the insulation sidewall corresponding to the shielding portion.

It is to be noted that a material of the insulation sidewall may include silicon nitride, silicon oxynitride, or silicon dioxide.

According to the method for manufacturing a semiconductor structure provided in the embodiment, a bit line 200 structure is formed on a substrate 100. The bit line 200 structure includes a plurality of bit lines 200 parallel to and spaced apart from each other. Each of the bit lines 200 is provided with an insulation block 300 on a side facing away from the substrate 100. A shielding portion 710 is formed on a top of the insulation block 300 that faces away from the substrate 100. A projection area of the shielding portion 710 on the substrate 100 is larger than a projection area of the insulation block 300 on the substrate 100. An insulation sidewall is formed on a sidewall of the bit line 200 and a sidewall of the insulation block 300, and a gap 900 extending to the substrate 100 is formed within the insulation sidewall corresponding to the shielding portion 710. Since the projection area of the shielding portion 710 on the substrate 100 is larger than the projection area of the insulation block 300 on the substrate 100, when the insulation sidewall is formed, a region between the shielding portion 710 and the substrate 100 will be sealed in advance, thus the gap 900 extending to the substrate 100 can be formed within the insulation sidewall corresponding to the shielding portion 710, so that the insulation sidewall can prevent a capacitor from being formed between the metal plug and the bit line 200. Compared with the step of subsequently forming the first insulation sidewall, the sacrificial layer, and the second insulation sidewall on the sidewall of the bit line 200 first, and then removing the sacrificial layer to form the gap 900 within the insulation sidewall composed of the first insulation sidewall and the second insulation sidewall, the step of the gap 900 being formed within the insulation sidewall at the same time when the insulation sidewall is formed simplifies the manufacturing process of the semiconductor structure and reduces manufacturing difficulty of the semiconductor structure.

Figure 4:
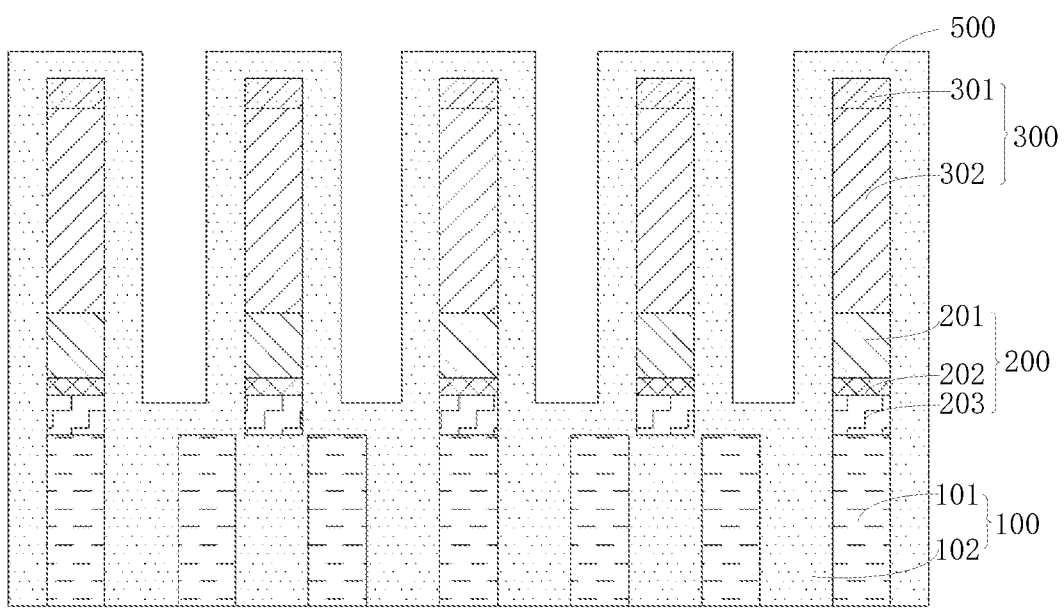
FIG. 4 is a sectional view of formation of a first sacrificial layer provided in an embodiment of the disclosure.

Referring to FIG. 4, in the above-mentioned implementation mode, the step of forming the sacrificial sidewall 510 includes the following steps. A first sacrificial layer 500 that covers the sidewall of the bit line 200, the substrate 100 between the adjacent bit lines 200, and the sidewall and the top of the insulation block 300 is formed. Then, the first sacrificial layer 500 on the top of the insulation block 300 is removed, that is, the sacrificial sidewall 510 may be formed.

A material of the first sacrificial layer 500 may include silicon oxide. In one possible implementation mode, the first sacrificial layer 500 may be deposited on a surface by an atomic layer deposition, and a reaction gas may include isopropylaminosilanes or oxygen. Of course, the reaction gas may also be the above-mentioned gases which are mixed at a certain ratio for use. Exemplarily, the first sacrificial layer 500 may be deposited by adopting a Double Pattern (DPT) method so as to prevent an edge of the first sacrificial layer 500 from blurring, thereby improving the accuracy of the subsequent processes.

Figure 5:
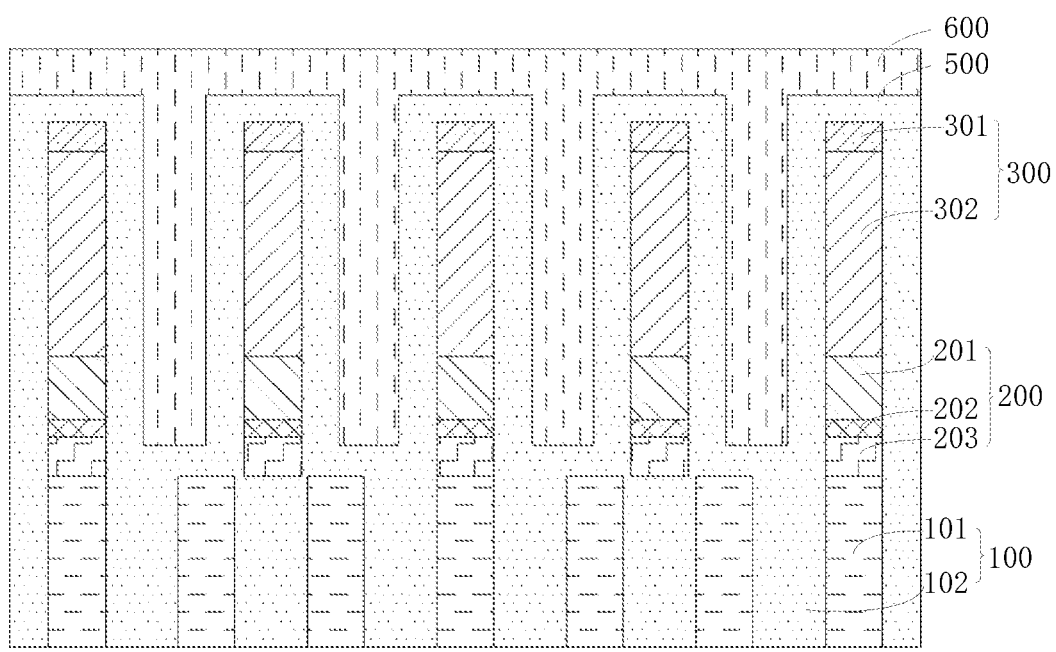
FIG. 5 is a sectional view of formation of a second sacrificial layer provided in an embodiment of the disclosure.

Referring to FIG. 5, after the first sacrificial layer 500 is formed, a second sacrificial layer 600 is formed so that the second sacrificial layer 600 covers the first sacrificial layer 500. A material of the second sacrificial layer 600 may be a hard mask material. In one possible implementation mode, the second sacrificial layer 600 may be formed by adopting the chemical vapor deposition.

Figure 6:
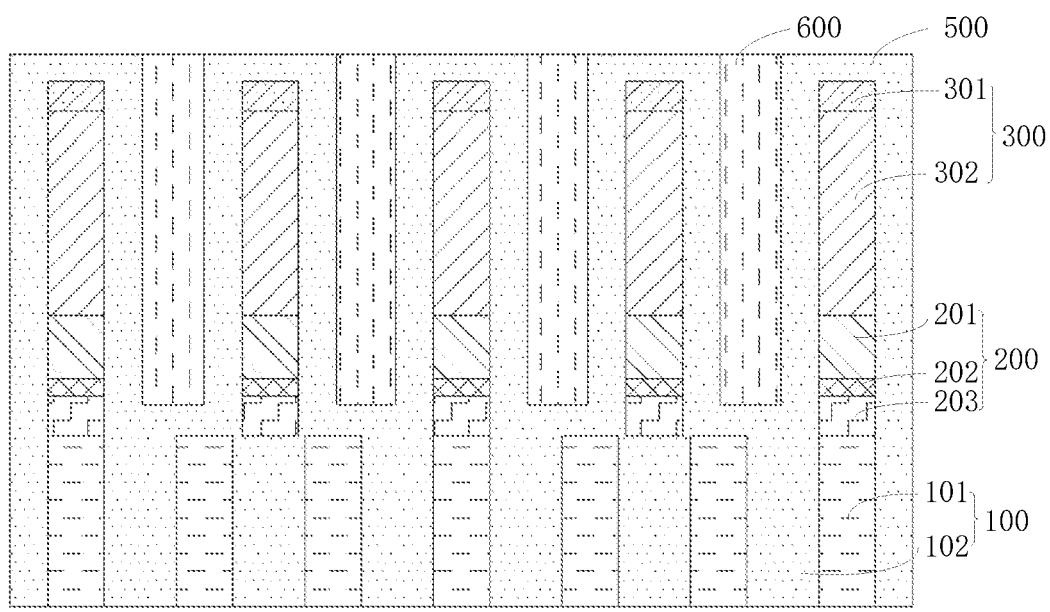
FIG. 6 is a sectional view of removal of a second sacrificial layer on a first sacrificial layer on a top of an insulation block provided in an embodiment of the disclosure.

Referring to FIG. 6, after the second sacrificial layer 600 is formed, the second sacrificial layer 600 on the first sacrificial layer 500 on the top of the insulation block 300 is removed so as to expose the first sacrificial layer 500 on the top of the insulation block 300. In one possible implementation mode, an etching process may be adopted to remove the second sacrificial layer 600, and the etching gas may include sulfur hexafluoride gas or tetrafluoromethane gas or trifluoromethane or oxygen gas or argon gas. Of course, the above-mentioned gases may be mixed at a certain ratio for use when etching.

Figure 7:
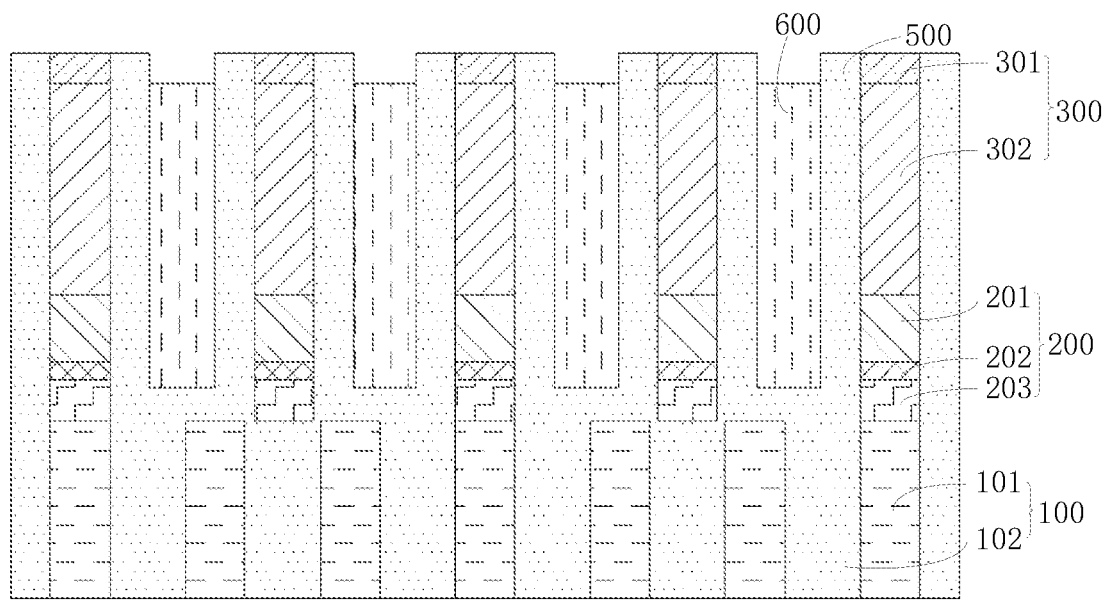
FIG. 7 is a sectional view of removal of part of a second sacrificial layer between adjacent bit lines provided in an embodiment of the disclosure.

Referring to FIG. 7, in an implementation mode where the insulation block 300 includes the first insulation block 302 and the second insulation block 301, part of the second sacrificial layer 600 between the adjacent bit lines 200 is removed so that a top surface of the second sacrificial layer 600 that faces away from the substrate 100 is flush with a top surface of the first insulation block 302 that faces away from the substrate 100, and therefore the first insulation block 302 is exposed. Exemplarily, the etching process may be adopted to remove the first sacrificial layer 500, and the etching gas may include sulfur hexafluoride gas or tetrafluoromethane gas or trifluoromethane or oxygen gas or argon gas. Of course, the above-mentioned gases may be mixed at a certain ratio for use when etching.

Figure 8:
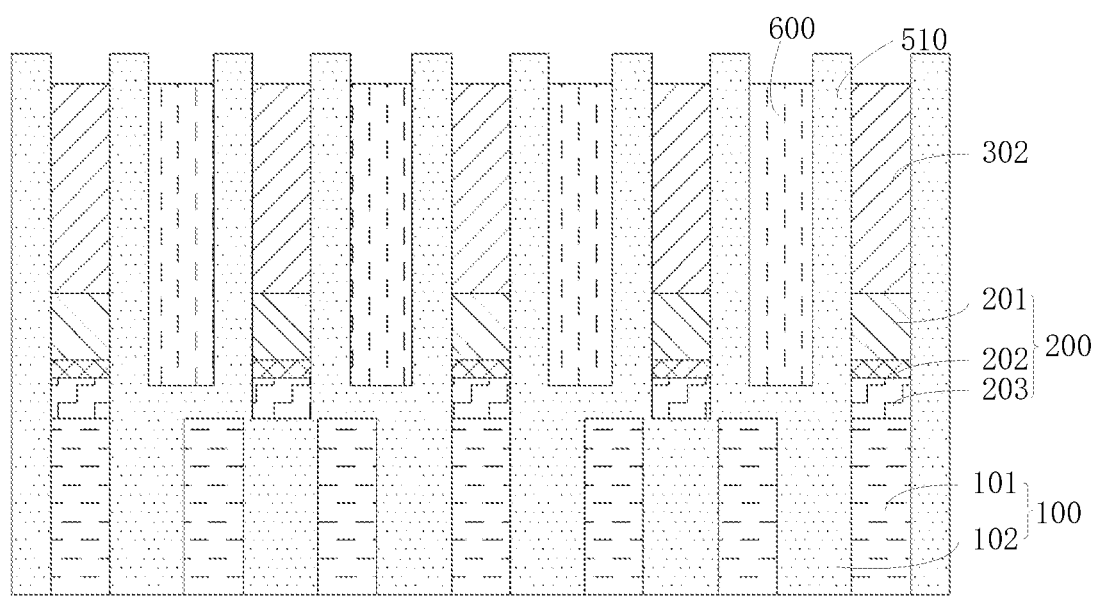
FIG. 8 is a sectional view of formation of an insulation sidewall provided in an embodiment of the disclosure.

Referring to FIG. 8, after the top surface of the second sacrificial layer 600 that faces away from the substrate 100 is flush with the top surface of the first insulation block 302 that faces away from the substrate 100, part of insulation block 300 is removed to form the sacrificial sidewall 510, and the height of the sacrificial sidewall 510 is greater than the sum of the height of insulation block 300 and the height of the bit line 200.

In the embodiment, in the implementation mode where the insulation block 300 includes the first insulation block 302 and the second insulation block 301, the second insulation block 301 may be removed so that both sides of the sacrificial sidewall have heights that are flush with each other, that is, the sum of the height of the first insulation block 302 and the height of the bit line 200 is equal to the sum of the height of the second sacrificial layer 600 and the height of the first sacrificial layer 500, which is beneficial to further process the sacrificial sidewall 510 to form the sacrificial block 520. In one possible implementation mode, the etching process may be adopted to remove the second insulation block 301.

As shown in FIG. 10 to FIG. 12, alternatively, the step of forming the shielding portion 710 on the top of the insulation block 300 that faces away from the substrate 100 also includes the following steps. A covering layer 700 is formed, in which part of the covering layer 700 is filled between sacrificial blocks 520 at both sides of the bit lines 200 to form the shielding portion 710.

The covering layer 700 may cover the top of the sacrificial block 520. As shown in FIG. 10, the covering layer 700 also covers the second sacrificial layer 600 so that the covering layer 700 can completely cover a curved top surface of the sacrificial block 520.

Referring to FIG. 11, after forming the covering layer 700, the following steps are also included. The covering layer 700 is thinned to form the shielding portion 710 between the sacrificial blocks 520 at both sides of the bit line 200.

It is to be noted that before the covering layer 700 is thinned, in order to make the surface of the covering layer 700 flush so as to form the shielding portion 710 having a regular shape subsequently, the covering layer 700 may be planarized. In one possible implementation mode, a chemical mechanical polishing process may be performed to planarize the covering layer 700.

The step of thinning the covering layer 700 includes the following steps. Part of the covering layer 700 is etched until part of sacrificial block 520 is exposed so as to exposes the top of the sacrificial block 520. After the covering layer 700 is thinned, the covering layer 700 between the adjacent two sacrificial blocks 520 is the shielding portion 710.

Alternatively, the step of forming the shielding portion 710 at the top of the insulation block 300 that faces away from the substrate 100 may also include the following steps. The insulation sidewall has a sacrificial block 520 at its top end that faces away from the substrate 100. A cross-sectional area of the sacrificial block 520 decreases gradually in a direction away from the substrate 100.

Figure 9:
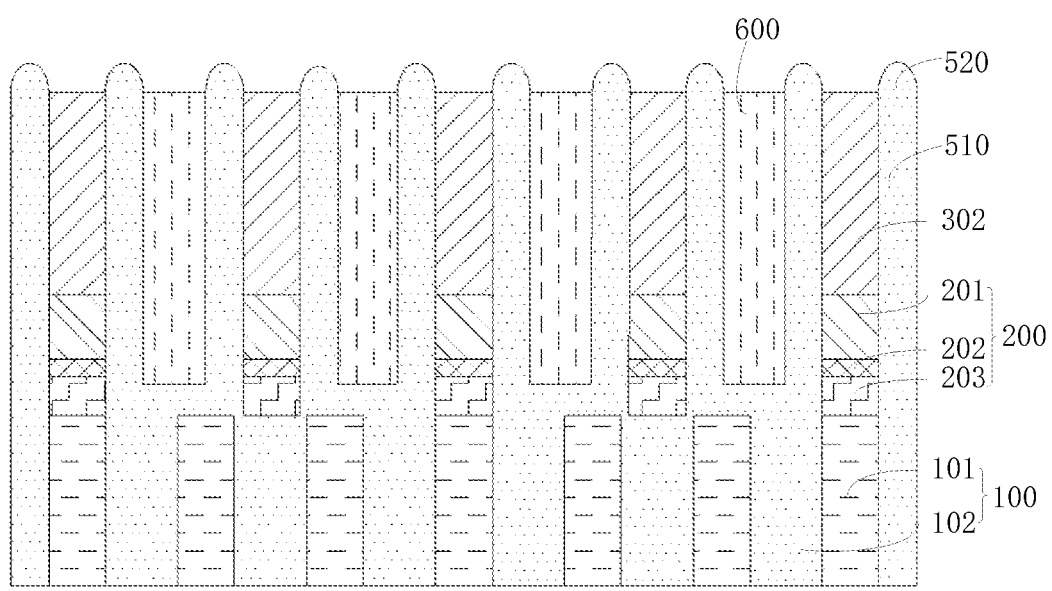
FIG. 9 is a sectional view of formation of a sacrificial block provided in an embodiment of the disclosure.

Referring to FIG. 9 to FIG. 11, in the embodiment, the top surface of the sacrificial block 520 may be a curved surface, and the center of the curved surface is at a side of the curved surface close to the substrate 100.

Further, the top of the sacrificial sidewall 510 may be etched by etching to form the sacrificial block 520. In this way, the dimensional accuracy of the sacrificial block 520 may be improved. Exemplarily, a gas plasma bombardment process may be adopted to bombard the top surface of the sacrificial block 520. It is to be noted that the gas plasma bombardment is a process that causes the bombarded object to be reduced by gas bombarding, and during the bombardment, a bombardment angle of the gas may be adjusted to form a top surface having a curved surface.

It is noteworthy that the second sacrificial layer 600 is provided between the adjacent bit line 200 structures, after the covering layer 700 is thinned, the shielding portions 710 are formed on both the side of the second insulation block 301 and the side of the second sacrificial layer 600 that face away from the substrate 100. As such, the sealing may further be made in advance when the insulation sidewall is formed so as to facilitate formation of the gap 900.

In an implementation mode where the top surface of the sacrificial block 520 is a curved surface, a contact surface where the sacrificial block 520 contacts the shielding portion 710 is a curved surface, and the center of the curved surface is at a side of the contact surface close to the substrate 100.

Referring to FIG. 12, after the shielding portion 710 is formed, the sacrificial sidewall 510 is removed so as to subsequently form the insulation sidewall at a position where the sacrificial sidewall 510 is located. In one possible implementation mode, the etching process may be adopted to remove the sacrificial sidewall 510, and the etching gas may include sulfur hexafluoride gas or tetrafluoromethane gas or trifluoromethane or oxygen gas or argon gas. Of course, the above-mentioned gases may be mixed at a certain ratio for use when etching.

Figure 13:
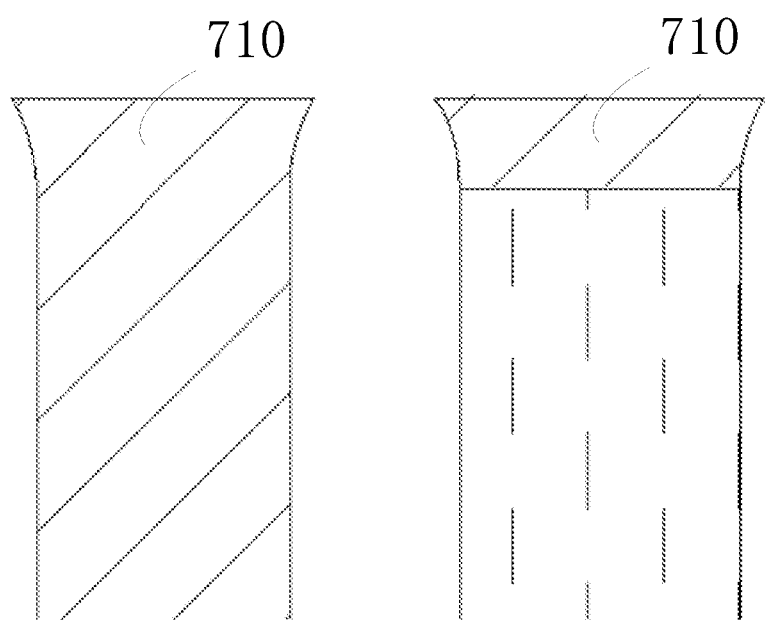
FIG. 13 is an enlarged view of the shielding portion in FIG. 12.

As shown in FIG. 12 and FIG. 13, in an implementation mode where the top surface of the sacrificial block 520 is a curved surface, a vertical section of the shielding portion 710 may be approximately an inverted trapezoidal structure, an oblique side of the trapezoidal structure is an arc, and the center of the arc is at a side of the arc that is closer to the substrate 100.

In one possible implementation mode, a material of the covering layer 700 may include silicon nitride, silicon oxide, or silicon oxynitride. In the embodiment, the material of the covering layer 700 may be, for example, silicon nitride, which may be deposited on a surface by the atomic layer deposition. The reaction gas may include ammonia or nitrogen or hydrogen. Of course, the reaction gas may also be the above-mentioned gases which are mixed at a certain ratio for use.

In one possible implementation mode, the etching process may be adopted to thin the covering layer 700, and the etching gas may include sulfur hexafluoride gas or tetrafluoromethane gas or trifluoromethane or oxygen gas or argon gas. Of course, the above-mentioned gases may be mixed at a certain ratio for use when etching.

Figure 14:
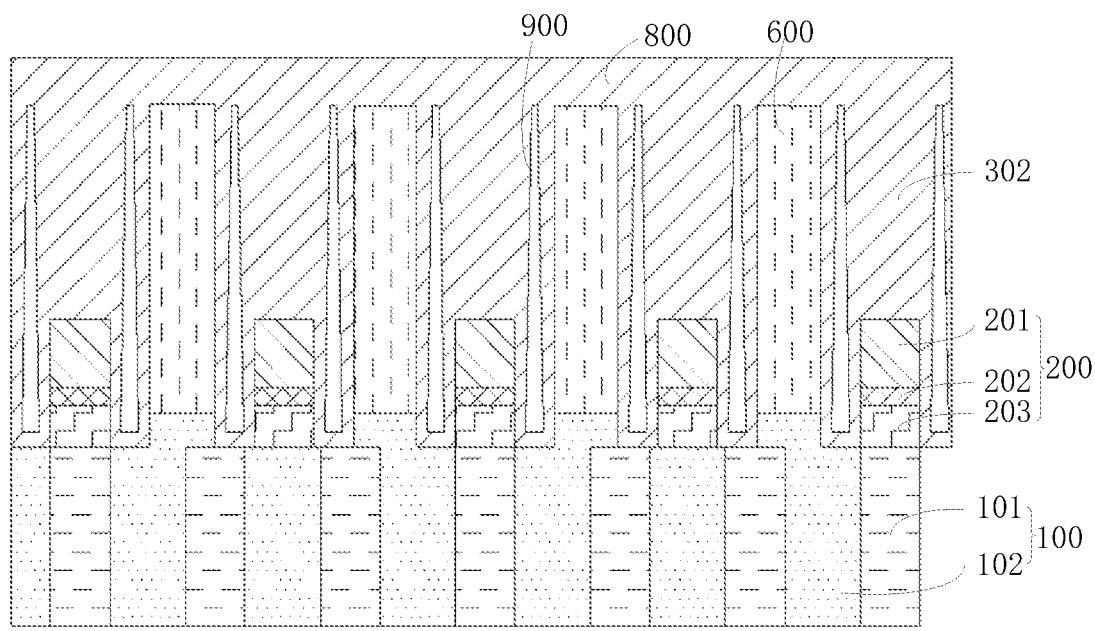
FIG. 14 is a sectional view of formation of an insulation material layer provided in an embodiment of the disclosure.

Referring to FIG. 14, after the sacrificial sidewall 510 is removed, the insulation sidewall is formed on the sidewall of the bit line 200 and the sidewall of the insulation block 300. It is needed to form an insulation material layer 800 on the shielding portion 710 and on the substrate 100 between adjacent two shielding portions 710 so as to form the insulation sidewall.

When the insulation material layer 800 is formed, since both the top end of the bit line 200 and the insulation block 300, and the top end of the second sacrificial layer 600 are provided with the shielding portions 710, and a horizontal distance of adjacent shielding portions 710 that are close to the substrate 100 is greater than a horizontal distance of the adjacent shielding portions 710 that are away from the substrate 100, the insulation material layer 800 may, when deposited, cause adjacent shielding portions 710 that are away from the substrate 100 to be closed in advance, that is, the top ends of the shielding portions 710 are closed in advance. Therefore, when the insulation material layer 800 is formed, part of space that corresponds to the shielding portion 710 and extends to the substrate 100 may not be filled with a material, thereby forming an insulation sidewall that has a gap 900.

It is to be noted that after the insulation material layer 800 is formed, in order to make the surface of the insulation material layer 800 flush so as to form the semiconductor structure having a regular shape subsequently, the insulation material layer 800 may be planarized. In one possible implementation mode, a chemical mechanical polishing process may be performed to planarize the insulation material layer 800.

In one possible implementation mode, the material of the covering layer 700 may include silicon nitride, silicon oxide, or silicon oxynitride. In the embodiment, the material of the covering layer 700 may be, for example, silicon nitride, which may be deposited on a surface by the atomic layer deposition. The reaction gas may include ammonia or nitrogen or hydrogen. Of course, the reaction gas may also be the above-mentioned gases which are mixed at a certain ratio for use.

Figure 15:
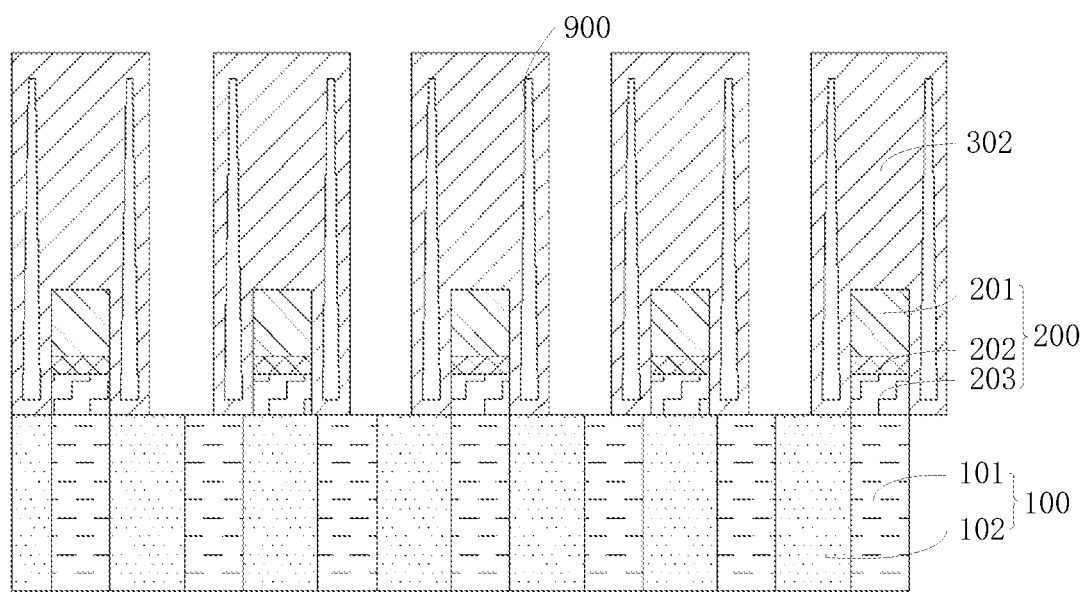
FIG. 15 is a sectional view of formation of a semiconductor structure having a gap provided in an embodiment of the disclosure.

Referring to FIG. 15, the insulation material layer 800 and the shielding portion 710 are etched until the second sacrificial layer 600 is exposed, and finally the second sacrificial layer 600 and the first sacrificial layer 500 are removed so as to remove products of the processes except for the insulation sidewall and thus the semiconductor structure having a gap 900 is formed.

In one possible implementation mode, the etching process may be adopted to remove the insulation material layer 800, the shielding portion 710, the second sacrificial layer 600, and the first sacrificial layer 500. The etching gas may include sulfur hexafluoride gas or tetrafluoromethane gas or trifluoromethane or oxygen gas or argon gas. Of course, the above-mentioned gases may be mixed at a certain ratio for use when etching.

Referring to FIG. 2 to FIG. 15, the embodiment also provides a semiconductor structure, which is manufactured through the above-mentioned method for manufacturing a semiconductor structure.

The semiconductor structure in the embodiment may be a Dynamic Random Access Memory (DRAM). Of course, the semiconductor structure may also be another structure. The embodiment does not limit this.

The semiconductor structure includes a substrate 100, and a bit line 200 structure formed on the substrate 100. The bit line 200 structure includes a plurality of bit lines 200 parallel to and spaced apart from each other. Each of the bit lines 200 is provided with an insulation block 300 on a side facing away from the substrate 100. An insulation sidewall is formed on a sidewall of the bit line 200 and a sidewall of the insulation block 300, and a gap 900 extending to the substrate 100 is provided within the insulation sidewall. When the gap 900 is manufactured, a shielding portion 710 is formed on a top of the insulation block 300 that faces away from the substrate 100. A projection area of the shielding portion 710 on the substrate 100 is larger than a projection area of the insulation block 300 on the substrate 100. When the insulation sidewall is formed on the sidewall of the bit line 200 and the sidewall of the insulation block 300, a gap 900 extending to the substrate 100 is formed within the insulation sidewall corresponding to the shielding portion 710. Since the projection area of the shielding portion 710 on the substrate 100 is larger than the projection area of the insulation block 300 on the substrate 100, when the insulation sidewall is formed, a region between the shielding portion 710 and the substrate 100 will be sealed in advance, thus the gap 900 extending to the substrate 100 may be formed within the insulation sidewall corresponding to the shielding portion 710, so that the insulation sidewall can prevent a capacitance from being forming between a metal plug and the bit line 200. Compared with the step of subsequently forming a first insulation sidewall, a sacrificial layer, and a second insulation sidewall on the sidewall of the bit line 200 first, and then removing the sacrificial layer to form the gap 900 within the insulation sidewall composed of the first insulation sidewall and the second insulation sidewall, the step of the gap 900 being formed within the insulation sidewall at the same time when the insulation sidewall is formed simplifies the manufacturing process of the semiconductor structure and reduces manufacturing difficulty of the semiconductor structure.

Those skilled in the art may clearly appreciate that for convenience and concision of description, examples are only given according to division of the above-mentioned functional modules. In practice, the above-mentioned functions may be done by different functional modules as needed, that is, the internal structure of the device is divided into different functional modules to complete all or partial of the above-mentioned functions. The specific operating process of the above mentioned device may be referred to the correspond-

The invention claimed is:

1. A method for manufacturing a semiconductor structure, the method comprises:
   providing a substrate;
   forming a bit line structure on the substrate, the bit line structure comprising a plurality of bit lines parallel to and spaced apart from each other, and each of the bit lines being provided with an insulation block on a side facing away from the substrate;
   forming a shielding portion on a top of the insulation block that faces away from the substrate, a projection area of the shielding portion on the substrate being larger than a projection area of the insulation block on the substrate; and
   forming an insulation sidewall on a sidewall of the bit line and a sidewall of the insulation block, a gap that extends to the substrate being formed within the insulation sidewall corresponding to the shielding portion.

2. The method for manufacturing a semiconductor structure of claim 1, wherein the forming a shielding portion on a top of the insulation block that faces away from the substrate, a projection area of the shielding portion on the substrate being larger than a projection area of the insulation block on the substrate comprises:
   forming a sacrificial sidewall on the sidewall of the insulation block and the sidewall of the bit line, a height of the sacrificial sidewall being greater than a sum of a height of the insulation block and a height of the bit line, the insulation sidewall being provided with a sacrificial block at its top end that faces away from the substrate, the sacrificial block having a cross-sectional area that gradually decreases in a direction away from the substrate; and
   forming a covering layer, part of the covering layer being filled between the sacrificial blocks at both sides of the bit line so as to form the shielding portion.

3. The method for manufacturing a semiconductor structure of claim 2, wherein the covering layer covers a top of the sacrificial block;
   the method further comprises: after forming the covering layer, thinning the covering layer to form the shielding portion between the sacrificial blocks at both sides of the bit line.

4. The method for manufacturing a semiconductor structure of claim 3, the forming a sacrificial sidewall on the sidewall of the insulation block and the sidewall of the bit line comprising:
   forming a first sacrificial layer that covers the sidewall of the bit line, the substrate between adjacent bit lines, and the sidewall and the top of the insulation block; and
   removing the first sacrificial layer on the top of the insulation block to form the sacrificial sidewall.

5. The method for manufacturing a semiconductor structure of claim 4, wherein a top of the sacrificial sidewall is etched to form the sacrificial block.

6. The method for manufacturing a semiconductor structure of claim 5, wherein a top surface of the sacrificial block is a curved surface.

7. The method for manufacturing a semiconductor structure of claim 4, further comprising: after removing the first sacrificial layer on the top of the insulation block, removing part of the insulation block so that the height of the sacrificial sidewall is greater than the sum of the height of the insulation block and the height of the bit line.

8. The method for manufacturing a semiconductor structure of claim 7, wherein the insulation block comprises a first insulation block and a second insulation block that are superposed, and the first insulation block is between the second insulation block and the bit line;
   the removing part of the insulation block so that the height of the sacrificial sidewall is greater than the sum of the height of the insulation block and the height of the bit line comprises: removing the second insulation block.

9. The method for manufacturing a semiconductor structure of claim 8, further comprising:
   after forming the first sacrificial layer, forming a second sacrificial layer, the second sacrificial layer covering the first sacrificial layer; and
   the method further comprising:
   before removing the first sacrificial layer on the top of the insulation block, removing the second sacrificial layer on the first sacrificial layer on the top of the insulation block.

10. The method for manufacturing a semiconductor structure of claim 9, further comprising:
    after removing the first sacrificial layer on the top of the insulation block, removing part of the second sacrificial layer between adjacent bit lines so that a top surface of the second sacrificial layer that faces away from the substrate is flush with a top surface of the first insulation block that faces away from the substrate.

11. The method for manufacturing a semiconductor structure of claim 10, wherein the covering layer also covers the second sacrificial layer;
    the forming the covering layer comprises: removing the sacrificial sidewall;
    the method further comprises: after forming the insulation sidewall on the sidewall of the bit line and the sidewall of the insulation block,
    forming an insulation material layer on the shielding portion and the substrate;
    etching the insulation material layer and the shielding portion until the second sacrificial layer is exposed; and
    removing the second sacrificial layer and the first sacrificial layer.

12. The method for manufacturing a semiconductor structure of claim 1, wherein the forming a bit line structure on the substrate comprises:
    forming a conductive layer and an insulation layer which are stacked in sequence on the substrate;
    forming a lithography layer on the insulation layer, the lithography layer having an etching pattern thereon; and
    etching the insulation layer and the conductive layer with the lithography layer as a mask so as to form the bit line and the insulation block on a side of the bit line that faces away from the substrate.

13. The method for manufacturing a semiconductor structure of claim 12, wherein forming the conductive layer comprises:
  forming a first conductive layer, a conductive barrier layer and a second conductive layer which are stacked in sequence on the substrate.

14. The method for manufacturing a semiconductor structure of claim 12, wherein forming the insulation layer comprises:
  forming a first insulation layer and a second insulation layer which are stacked in sequence on the conductive layer.

15. A semiconductor structure, which is obtained by the method for manufacturing a semiconductor structure according to claim 1.

* * * * *